United States Patent
Parthasarathy et al.

(10) Patent No.: US 8,030,954 B1
(45) Date of Patent: Oct. 4, 2011

(54) INTERNAL VOLTAGE LEVEL SHIFTING FOR SCREENING COLD OR HOT TEMPERATURE DEFECTS USING ROOM TEMPERATURE TESTING

(75) Inventors: Srinivasa R. Parthasarathy, Singapore (SG); Lee Ni Chung, San Jose, CA (US); Jian Jun Shi, Singapore (SG); Randy J. Simmons, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 472 days.

(21) Appl. No.: 12/353,936

(22) Filed: Jan. 14, 2009

(51) Int. Cl.
*G01R 31/10* (2006.01)
(52) U.S. Cl. ................................. 324/750.05
(58) Field of Classification Search ............ 324/750.01–750.11, 750.14, 762.01–762.09, 719; 327/539, 327/512, 83, 138; 323/280, 314; 438/14–18
See application file for complete search history.

(56) References Cited

U.S. PATENT DOCUMENTS 5,465,063 A * 11/1995 Fukuda et al. ............... 327/512
7,307,468 B1 * 12/2007 Vasudevan .................. 327/539
7,400,123 B1   7/2008 Voogel

OTHER PUBLICATIONS

Malinoski et al., *Rapid-Response Temperature Control Provides New Defect Screening Opportunities*, IEEE, ITC Int'l Test Conf., paper 32.1, pp. 903-907 (2001).
Nigh et al., *Test Method Evaluation Experiments & Data*, IEEE, Proceedings of the 2000 IEEE International Test Conference, pp. 454-463 (2000).
Schuermyer et al., *Minimum Testing Requirements to Screen Temperature Dependent Defects*, IEEE, ITC Int'l Test Conf., paper 11.2, pp. 300-308 (2004).
Tarun et al., *Room Temperature Defect Localization of Hot and Cold Failures using Scanning Probe Microscopy Techniques*, IEEE, Physical and Failure Analysis of Integrated Circuits, 2005, Proceedings of the 12th Int'l Symposium, IPFA, pp. 5-8 (2005).

* cited by examiner

*Primary Examiner* — Jermele M Hollington
*Assistant Examiner* — Tung X Nguyen
(74) *Attorney, Agent, or Firm* — Scott Hewett

(57) ABSTRACT

Operation of an internal voltage supply level (Vgg) of an IC is characterized over operating temperature or at a selected temperature to determine a temperature-equivalent internal voltage level. The internal voltage supply of the IC is set to the temperature-equivalent level, and the IC is tested at room temperature to screen for low-temperature defects or high-temperature defects.

20 Claims, 5 Drawing Sheets

INTERNAL VOLTAGE LEVEL SHIFTING FOR SCREENING COLD OR HOT TEMPERATURE DEFECTS USING ROOM TEMPERATURE TESTING

FIELD OF THE INVENTION

The present invention generally relates to integrated circuits ("ICs"), and more particularly to techniques for electrically testing ICs at room temperature to simulate cold or hot temperature operation.

BACKGROUND

Many ICs have stringent operating requirements, and are required to operate over a variety of conditions, such as varying voltage/current levels/timing and ambient temperatures. The testing procedures for complex ICs, such as field-programmable gate arrays ("FPGAs"), application-specific integrated circuits ("ASICs"), microprocessors, and memories can be very time consuming and represent a significant portion of the total manufacturing time and cost.

Non-room temperature testing is particularly expensive because it uses hot or cold test fixtures, which are relatively expensive compared to room temperature ("RT") test fixtures, and the device under test must be brought to the appropriate temperature, which adds time into the test sequence. Testing a device at a temperature hotter than room temperature can be twice as costly, and testing a device at a temperature colder than room temperature can be four to six times as costly.

Many approaches have been tried to meet quality requirements over a wide range of temperatures for ICs. Testing each IC at both ends of the devices' specified temperature operating range is direct, time consuming, and expensive, but acceptable for some devices, such as low-volume specialty devices. Other devices are 100% tested at room temperature and high temperature, but are only sampled for testing at cold temperature. Unfortunately, sampling cannot assure the required quality for all IC products, and price constraints often preclude 100% cold testing of high-volume parts.

Techniques have been developed to associate cold (or hot) IC failures with single temperature (typically RT) electrical measurements. One technique varies the external electrical test conditions, such as varying an external test voltage, to simulate or mimic low or high temperature operation. Other techniques use test guard bands (i.e., more stringent RT test limits, also called parametric modification), sometimes in conjunction with varied electronic test conditions, to identify ICs that have a propensity for failure at the maximum or minimum operating temperature based on statistical characterization of the IC and the test conditions. However, parametric modification of external test conditions is not able to identify all possible low-temperature failures.

Techniques for detecting defects in ICs that manifest at cold or hot temperatures using RT electrical testing that avoids the limitations of the prior art are desired.

SUMMARY

Operation of an internal voltage supply level (e.g., Vgg) of an IC is characterized over operating temperature to determine an internal voltage level at a hot temperature or a cold temperature. The internal voltage supply of the IC is set to a hot or cold temperature-equivalent level, and the IC is tested at room temperature. The temperature-equivalent internal voltage level creates an "electrically cold" or "electrically hot" environment to screen for low-temperature defects or high-temperature defects at room temperature.

DETAILED DESCRIPTION

Figure 1:
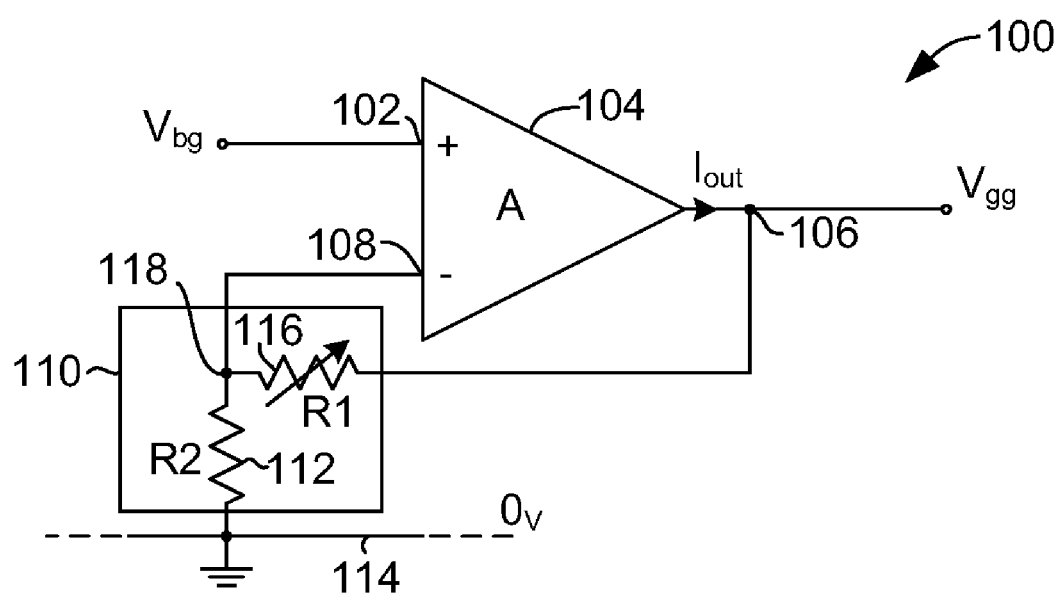
FIG. 1 is a circuit diagram of a portion of an on-chip voltage supply according to an embodiment of the present invention.

Defects in ICs that manifest at cold temperature or high temperature operation are detected during RT electrical testing by varying an internal voltage (Vgg). During normal operation of the IC, the internal voltage is regulated to a selected level using a band gap voltage reference (Vbg), and feedback control circuitry. While conventional RT testing includes varying external voltage levels (i.e., the voltage supply settings connected to the IC during electrical test), supply currents (e.g., IDDQ), and I/O levels, varying these external voltages does not generally affect internal voltages, such as Vgg, until the external voltage(s) is well outside of the operating range for the IC.

Evaluations of ICs that failed cold-temperature testing showed sensitivity to an internal voltage level. By adjusting the internal voltage level to mimic cold temperature performance of the IC (i.e., by setting the internal voltage level to a low-temperature equivalent voltage level), failures that would only otherwise arise during cold temperature testing could be caught (screened) during RT testing. In a particular embodiment, the IC is an FPGA that includes a resistor network that sets a gain factor of an internal voltage supply. A resistor value is chosen to set the gain factor of an internal voltage supply to produce a regulated voltage that mimics low-temperature conditions (i.e., a low-temperature equivalent voltage level). The regulated voltage level is shifted from the RT regulated voltage, and for purposes of convenient discussion will be called "level-shifted Vgg". In an alternative embodiment, the Vgg level is shifted to mimic high-temperature operation and the IC is tested at room temperature to screen for high-temperature defects.

Characterization was done on how Vgg varies with respect to temperature and also with respect to different resistor mode settings of gain circuitry. The resistor mode setting corresponding to the Vgg at low-temperature was identified. This mode was set as an attribute in the configuration bitstream used to program the FPGA. A configuration pattern (file) of the FPGA was loaded to the FPGA IC during RT testing to shift the operation point of the internal voltage supply, apart from programming the FPGA. Shifting the Vgg level and testing the IC at RT captured temperature-sensitive defects in the IC. In one embodiment, silicon defects known to parametrically fail at cold temperatures were captured during RT testing by setting the internal voltage supply level to mimic cold-temperature operation. In an alternative embodiment, parametric operating attributes, such as current draw and operating frequency, are characterized as a function of temperature (internal voltage level) and screened at RT test. Vgg is used as a convenient example in specific embodiments.

Other internal voltages (i.e., voltages produced in the IC that are not directly user-accessible at a pin or pad of the IC) are alternatively varied. In an alternative embodiment, an internal voltage level is shifted to mimic high-temperature operation of the IC by programming an internal voltage generation circuit of the IC.

FIG. 1 is a circuit diagram of a portion of an on-chip voltage supply 100 according to an embodiment of the present invention. A band-gap voltage source supplies a reference voltage Vbg to the positive input 102 an operational amplifier 104. Feedback is provided from the output 106 to the negative input 108 of the operational amplifier 104 through a programmable voltage divider network 110. The programmable voltage divider network 110 includes a fixed resistor 112 in series between ground 114 and a programmable resistor 116. The programmable resistor 116 is set to a value to produce a Vgg level that occurs at a hot or cold operating temperature of the circuit in order to test the circuit at room temperature to screen for temperature-dependent defects. The programmable resistor value is different from the standard (default) room temperature setting. In one embodiment, the programmable resistor 116 includes a resistor value that is designed for test to produce a Vgg level that mimics hot or cold temperature operation. A node 118 between the series resistors 112, 116 is connected to the negative input 108 of the operational amplifier 104. In alternative embodiments, R1 is fixed and R2 is variable, or both R1 and R2 are variable resistors. Vgg can also be varied by connecting it to external supply (viz: Vdd/Vcore) by by-passing the internal voltage generator circuit. This is useful if cold reject surface out only when Vgg needs to be reduced below the lowest resistor mode settings. Tying Vgg to Vdd or other settable external voltage supply is not a feature that is normally assessable by a user. In normal operation, Vgg is generated by a Vgg generation circuit, that is directly powered by an external voltage supplie(s) operating within specified voltage limits according to the Vgg generation circuitry.

Open-loop gain of an operational amplifier is typically taken to be essentially infinite, and the output voltage Vgg of the voltage supply 100 computed based on non-inverting op-amp mode is:

$$Vgg = Vbg*(1+R1/R2) \quad (Eq.\ 1)$$

Figure 2A:
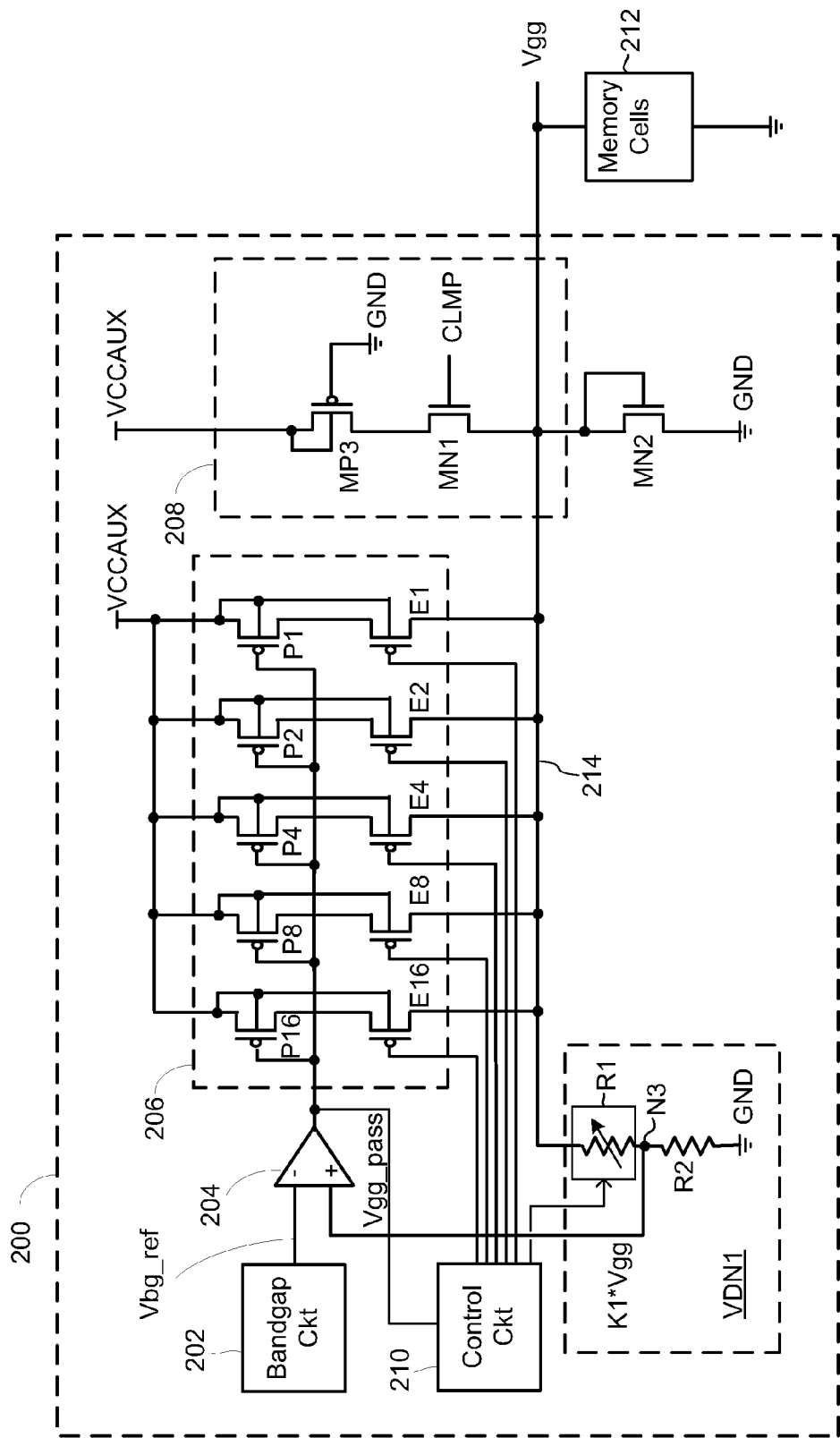
FIG. 2A is a diagram of a voltage supply circuit of an IC according to an embodiment of the present invention.
Figure 2B:
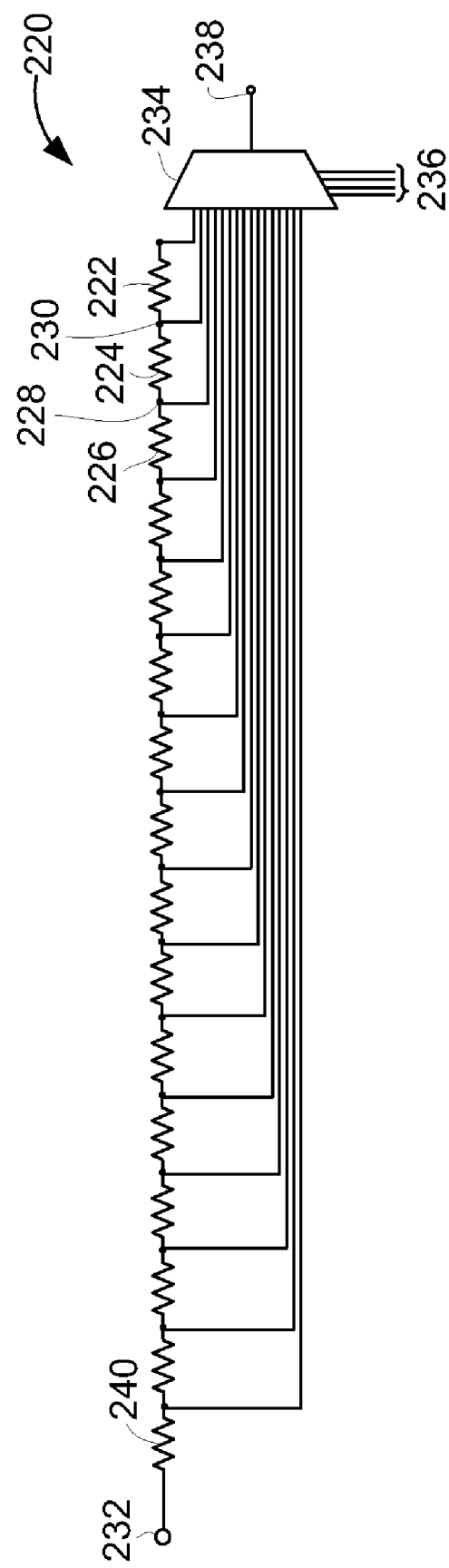
FIG. 2B shows a variable resistor suitable for use in the voltage supply circuit of FIG. 2A.

In a particular embodiment, R1 includes sixteen resistors in series with a 16×1 multiplexer selectively switching between the multiplexer input to provide sixteen different resistance values for R1 according to a control signal provided to the multiplexer, as shown in FIG. 2B. Other variable resistors are alternatively used.

The programmable resistor R1 is incorporated in FPGAs to set Vgg at a desired voltage for circuit operation. Vgg is typically set to a relatively high voltage level as default for improved circuit operation when the FPGA is used in an application (other levels can also be set as defaults in other embodiments), and is typically set to a relatively low level when testing at RT to screen cold-temperature defects. In some embodiments, an FPGA is fabricated with a Vgg generator circuit that is adjustable over a normal operating range that includes a voltage level suitable for mimicking cold-temperature operation or suitable for mimicking high-temperature operation. In an alternative embodiment, a voltage setting (e.g., resistor value) is included in an FPGA that provides a voltage level outside the normal settable range of Vgg to mimic cold-temperature operation or high-temperature operation. For example, the FPGA is designed for test ("DFT") and fabricated to include a resistor value in the Vgg generator circuit that is used only for RT screening of cold-temperature defects or for screening of hot-temperature defects, and sets the Vgg to a level not used during normal operation. In one embodiment, the DFT has lower resistance than any other resistor in the programmable resistor (e.g., the resistor next to node 232 in FIG. 2B). In an alternative embodiment, the DFT resistor has a higher resistance than any other resistor in the programmable resistor.

FIG. 2A is a diagram of a voltage supply circuit 200 of an IC according to an embodiment of the present invention. A voltage supply circuit generally in accordance with circuit 200 is further described in commonly owned U.S. Pat. No. 7,400,123 B1 entitled "Voltage Regulator with Variable Drive Strength for Improved Phase Margin in Integrated Circuits", by Martin L. Voogel, issued Jul. 15, 2008, the disclosure of which is hereby incorporated by reference in its entirety for all purposes.

In a particular embodiment, the voltage supply circuit 200 is incorporated in an FPGA. Voltage supply circuit 200 includes a bandgap circuit 202, an operational amplifier 204, a pull-up network 206, a start-up circuit 208, a leaker circuit (diode-coupled transistor) MN2, and a control circuit 210.

Pull-up network 206 includes five pull-up transistors P1, P2, P4, P8, and P16. Pull-up transistors P1, P2, P4, P8, and P16 are implemented as PMOS transistors with bodies tied to the auxiliary voltage supply VCCAUX. In a particular embodiment, P1 has a first channel width, P2 has twice the channel width of transistor P1, P4 has four times the channel width of transistor P1, and so forth. Each pull-up transistor has a source terminal coupled to the auxiliary voltage supply VCCAUX, and a gate terminal coupled to the pass voltage output terminal Vgg_pass of operational amplifier 204. Each pull-up transistor P1, P2, P4, P8, and P16 has a drain terminal coupled to the source terminal of an enable transistor E1, E2, E4, E8, and E16, respectively. Enable transistors E1, E2, E4, E8, and E16 are implemented as PMOS transistors with bodies tied to VCCAUX. The drain terminals of the enable transistors are coupled to regulated voltage node 214. The gate terminal of each enable transistor is coupled to receive a different enable signal from control circuit 210. Bandgap reference voltage Vbg_ref may be provided to a plurality of operational amplifiers distributed across the integrated circuit (not shown).

Bandgap circuit 202 provides a bandgap reference voltage Vbg_ref. Operational amplifier 204 generates a value for pass voltage Vgg_pass that results in a negligible voltage differential between its input terminals, thereby maintaining the regulated voltage Vgg approximately equal to the voltage of bandgap reference voltage Vbg_ref. Pass voltage Vgg_pass, which drives the pull-up transistor network 206, is adjusted by operational amplifier 204 so that the current provided by pull-up transistor network 206 pulls up regulated voltage Vgg in response to dips in Vgg caused by leakage current in memory cells 212. In this manner, the dynamic current provided by pull-up transistor network 206 compensates for leakage current in memory cells 230 to maintain the regulated voltage Vgg at the desired voltage level.

Voltage supply circuit 200 has an added functionality, which allows the effective channel width of the pull-up network 206 to be dynamically controlled. This capability allows voltage supply circuit 200 to avoid reducing phase margin more than is necessary to enable proper functioning of the integrated circuit. This capability is provided by control circuit 210 and the configurable nature of pull-up transistor network 206. Control circuit 210 continually checks the regulated voltage Vgg and tries to keep the regulated voltage Vgg at a desired level, by adjusting the strength of pull-up network 206, e.g., by turning on and off additional pull-ups in the network. The Vgg supply output voltage can be programmed by addressing the programmable resistor network to provide the desired feedback, and in a particular embodiment, the programmable resistor is set so as to provide the lowest Vgg output voltage available on the chip under standard operating conditions.

The maximum current that can be handled by the pull-up network 206 should be more than the estimated worst case leakage from memory cells 212, plus a safety margin. In other words, the total number of pull-ups in pull-up network 206 must be large enough to cover the most severe anticipated leakage current, plus the safety margin. In known voltage supply circuits, the pull-up strength is typically over-designed for most applications. In the voltage supply circuit 200, under these conditions the number of active pull-ups can be reduced by disabling the unneeded pull-ups, which reduces the gain of the closed loop, which in turn improves the phase margin of the circuit.

Voltage supply circuit 200 includes a voltage divider network VDN1 coupled between regulated voltage node 214 and the positive input terminal of operational amplifier. The voltage divider network VDN1 includes resistors R1 and R2, coupled together in series between regulated voltage node 214 and ground as described above in reference to FIG. 1. Voltage divider network VDN1 provides a ratioed voltage of K1*Vgg to operational amplifier 204, where the value of K1 is determined by the relative resistances of resistors R1 and R2. The variable resistor R1 is a programmable resistor network controlled by the control circuit 210 according to digital instructions provided to the IC by the user or manufacturer, and is set to a value to produce a Vgg level that mimics hot temperature or cold temperature operation of the IC for room temperature testing to screen temperature dependent defects.

FIG. 2B shows a variable resistor 220 suitable for use in the voltage supply circuit of FIG. 2A (i.e., as R1). The variable resistor 220 includes sixteen resistors 222, 224, 226 in series with intervening nodes 228, 230. A multiplexer 234 selects which node (tap) is connected to output 238 of the multiplexer 234, which in this example is a 16×1 multiplexer controlled by 4 mode lines 236, but alternatively has more or fewer inputs. The four mode lines 236 (which provide four-bit selectivity, hence 16 modes of the programmable resistor) come from control circuit 210 of FIG. 2A, for example, but other logic could be used to control the programmable resistor. In one embodiment, a first end 232 of the resistor network is connected to node N3 of FIG. 2A (see also, node 118 of FIG. 1) and the output 238 of the multiplexer 234 is connected to Vgg line 214 of FIG. 2A (see also, node 106 of FIG. 1). Alternatively, the output 238 of the multiplexer is connected to node N3 and the end 232 of the resister network is connected to the Vgg line. In one embodiment, all sixteen resistors have essentially the same resistance. In alternative embodiments, different resistors have different values. In another embodiment, one or more resistors can be designed in the gain circuitry that is programmable exclusively to generate an internal voltage (Vgg) equivalent to low-temperature or high-temperature operation of the circuit. For example, resistor 240 is designed to be a value that produces a Vgg level that occurs at hot or cold temperatures. In one embodiment, resistor 240 has a lower resistance than other resistors in the network. In another embodiment, this resistor (i.e., the resistor or resistance setting designed for room temperature screening of temperature-dependent defects) is locked out for normal usage by customers/users.

In a particular embodiment, the FPGA is configured with a first Vgg mode to set Vgg to a low-temperature condition or a high-temperature condition, and then reconfigured with a second Vgg mode to set Vgg to the default (e.g., standard room temperature) condition. The multiplexer 234 is connected to the plurality of nodes (viz: 228, 230 etc.) and provides an output 238. A first test configuration bitstream configures the multiplexer to connect to a first node to provide a first resistance and the second test configuration bitstream configures the multiplexer to connect to a second node to provide a second resistance. The first and second resistances provide first and second levels of Vgg.

Figure 3:
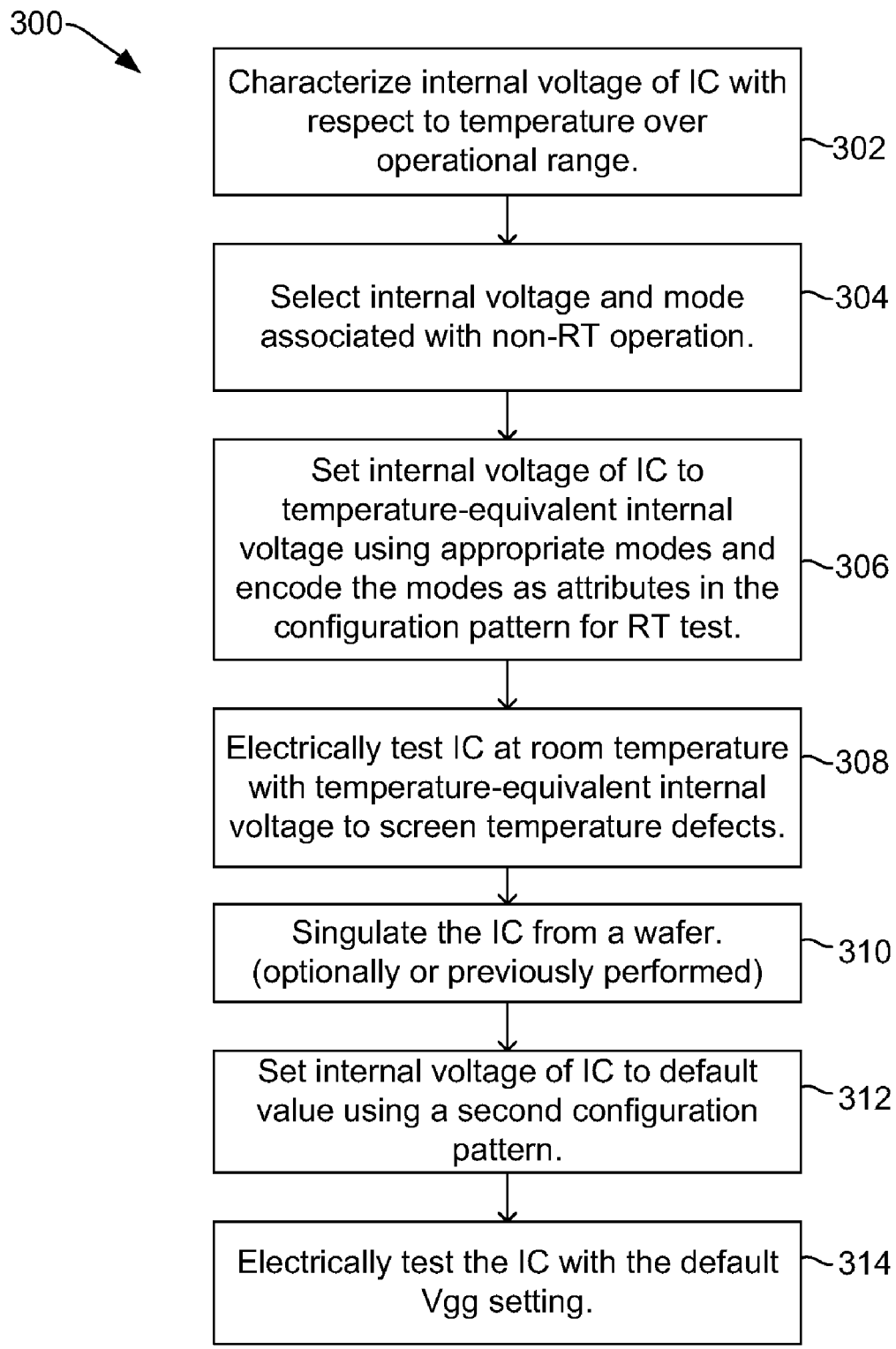
FIG. 3 is a flow chart of a method of testing an IC according to an embodiment of the present invention.

FIG. 3 is a flow chart of a method of testing an IC 300 according to an embodiment of the present invention. An internal voltage of the IC is characterized with respect to temperature (step 302), and an internal voltage level associated with high or low temperature operation of IC is selected ("temperature-equivalent internal voltage") (step 304). As used herein, "associated with" means that the temperature-equivalent internal voltage is the internal voltage level produced by the IC when operating at the low or high temperature. In a particular embodiment, the low or high temperature is a minimum or maximum specified operating temperature of an IC. The minimum specified operating temperature often varies with respect to different grades of the IC. For example, an industrial grade might be specified to a minimum operating temperature of minus forty degrees Celsius, which a commercial grade of the same part is specified to zero degrees Celsius, and a military or automotive grade of the same part is specified to minus fifty-five degrees Celsius.

The temperature characteristic of Vgg for FPGAs over a wide temperature range, both above and below RT, was performed. Alternatively, characterization of Vgg at a specified low temperature or a specified high temperature is alternatively performed. Although Vgg is internally generated, the value of Vgg may be measured by probing the Vgg output node. In a particular embodiment, several FPGA devices were tested at −50 degrees Celsius, zero degrees Celsius, 25 degrees Celsius, and 125 degrees Celsius. These tests indicated that Vgg for an FPGA chip that operated at about 1.42 Volts at RT could drop as low as 1.33 Volts at −40 degrees Celsius. For example, temperature testing was performed on two different device types—3e250e and 3e500e, both in the SPARTAN 3E™ family of FPGAs available from XILINX, INC., of San Jose, Calif. Samples were taken from opposite process corners, commonly called fast-fast ("FF") and slow-slow ("SS") process corners (which are known to produce variations in threshold voltage and other operating characteristics of the IC), as well as typical-typical ("TT") parts to characterize Vgg variability versus operating temperature for a wide range of parts. As a result of the temperature testing, it was determined that the lowest Vgg setting (i.e., the resistor value that generated the lowest value of Vgg), created the "electrically cold" environment associated with −40 degrees Celsius. In other devices, or for mimicking other temperatures, the lowest Vgg setting might not be appropriate and alternative settings used.

The internal voltage is selectively set to the temperature-equivalent internal voltage (step 306). In a particular embodiment, the internal voltage is Vgg of an FPGA, and is set by programming a programmable resistor in a Vgg generation circuit using a test configuration bitstream (configuration pattern). In a particular embodiment, the test configuration bitstream configures the Vgg generator circuit in the FPGA to a Vgg setting unavailable (i.e. blocked) to the end user of the FPGA.

The IC is electrically tested at room temperature to screen for low-temperature defects or high temperature defects or failures (step 308). In a particular embodiment, silicon defects not caught at RT test due to RT parametric guard bands are screened by lowering the on-chip internal voltage supply to electrically mimic a cold operating environment for the IC (low-temperature equivalent internal voltage level). In an alternative embodiment, silicon defects not caught at RT test are screened by programming the on-chip internal voltage supply to electrically mimic a hot operating environment of the IC (high-temperature equivalent internal voltage level).

In a further embodiment, the IC is re-configured according to a second test configuration bitstream (step 312) that sets the internal voltage to a default (i.e., normal operating) level, and the IC is re-tested (step 314). In a particular embodiment, re-testing is done after packaging and at a different temperature when compared to the first insert, for example, at wafer sort. Re-configuring and re-testing the IC provides test results at both cold-mimicking Vgg level and standard Vgg level. In a particular embodiment, the re-testing is done at RT, and in a further embodiment is done at final (chip) test, and the first testing (step 308) is done at wafer test.

In an embodiment, wafer sort is done at room temperature with Vgg-level-shifted patterns to screen low temperature defects by creating an "electrically-cold" environment (step 308). To maximize quality of test screening, final test, which is typically done on ICs in packaged form, is done at an elevated (hot) temperature using default Vgg-setting patterns. Performing RT wafer test using one or more embodiments of the invention is particularly desirable to avoid having to place the entire wafer, test fixture, and wafer probe system into a cold chamber for actual cold-temperature testing. Screening low-temperature failures at RT wafer test using embodiments also removes parts that would fail cold insert testing from the process stream, avoiding subsequent test effort. This is particularly desirable for parts that will receive 100% cold insert testing. Hot testing at final test is particularly effective to screen out performance related defects and also sort parts to different part numbers based on the key performance indices, such as $I_{CC}$, and speed. In a particular embodiment, the IC is singulated from the wafer (step 310) before the second electrical test (step 314).

Particular FPGAs were simulated and tested using techniques according to embodiments. Hardware verification at room temperature was done by by-passing the Vgg circuitry (which is not directly available at a device pin or pad), connecting an external power supply (e.g., Vcore or Vdd) to the fabric block using special (i.e., non-user) mode settings in the configuration bitstream of the FPGA and executing standard functional patterns for electrical tests.

Failures were detected at RT when Vcore was set to the minimum allowable condition. This indicated that blocks fail when internal voltages drop. Further investigation of the relationship between Vgg and temperature testing was performed on two types of FPGAs, as described above. It was found that Vgg drops with decreasing temperature, which triggers test failures on defective parts. The FPGA included programmable Vgg generation circuitry (see, FIGS. 2A, 2B), which allowed setting Vgg to a value simulating low-temperature conditions while the FPGA was tested at RT using Vcore/Vdd supply values consistent with standard testing.

In a particular embodiment, a low-temperature operating condition of minus forty degrees Celsius was simulated by reducing an RT Vgg level from an RT operating point of about 1.39 V to about 1.33 V. This low Vgg level was achieved by programming the resistor network in the on-chip voltage supply (Vgg supply) by addressing the Vgg generation circuitry to provide a control signal to the variable resistor to produce the desired Vgg, which in this example was the lowest Vgg attainable on the IC using standard Vgg generation circuitry and external supply levels.

The FPGA had a nominal cold temperature (−40 degrees C., "cold insert test") failure rate, which was determined by sample testing of devices at the cold temperature condition. In an experiment, FPGAs were tested at RT using default/standard Vgg-setting patterns to identify good parts. The FPGAs that passed were then tested at RT using Vgg-level (i.e., electrically cold Vgg) shifted patterns. The parts that failed the RT testing using Vgg-level shifted patterns also failed cold temperature testing using standard Vgg-setting patterns. This confirmed that the parts failing RT Vgg-level shifting testing also failed cold temperature testing (no overkill/yield losses). The parts that passed the RT testing using Vgg-level shifted patterns were also tested at cold temperature using standard Vgg-setting patterns, and no Vgg-related failures were obtained. This confirmed no underkill using the new method.

FPGAs were tested at RT using the reduced Vgg level to simulate cold temperature conditions. Parts failing the RT cold screening were removed from the sample population, and samples of the remaining of the FPGAs were tested at cold temperature. The cold temperature failure rate was reduced about 25%. While not all of the cold temperature failures were caught at RT cold test simulation, screening these parts avoided wasting cold test time and resources on them. In other words, the parts that were screened using RT cold-mimicking techniques could be used for a grade with less stringent cold-temperature operating specifications, and the remaining parts tested at cold-insert for grades of parts having more stringent cold-temperature operating specifications.

Cold insert testing typically requires a physical insertion of the IC under test into the cold temperature test fixture, and then removal and re-insertion into an RT or hot temperature test fixture. Cold insert testing is relatively expensive, typically costing four to six times more than hot test or RT test. Embodiments of the invention provide superior quality by screening out ICs that would fail cold temperature testing/operation without incurring the cost of cold insert testing. By removing cold defects at wafer sort, the cost of packaging defective dies is also avoided.

A post analysis of cold insert testing of ICs captured by testing according to one embodiment of the present invention verified that the screened parts also failed cold insert testing. In other words, the RT simulation was not overly sensitive, and did not cause good parts to be rejected. Performing the simulated cold-temperature testing at RT had no increase in RT test time where done in lieu of conventional RT wafer test, and test quality was not sacrificed, as the fault-coverage in the test patterns were not changed from standard device test. Testing ICs according to embodiments provides higher quality parts with fewer material returns.

Figure 4:
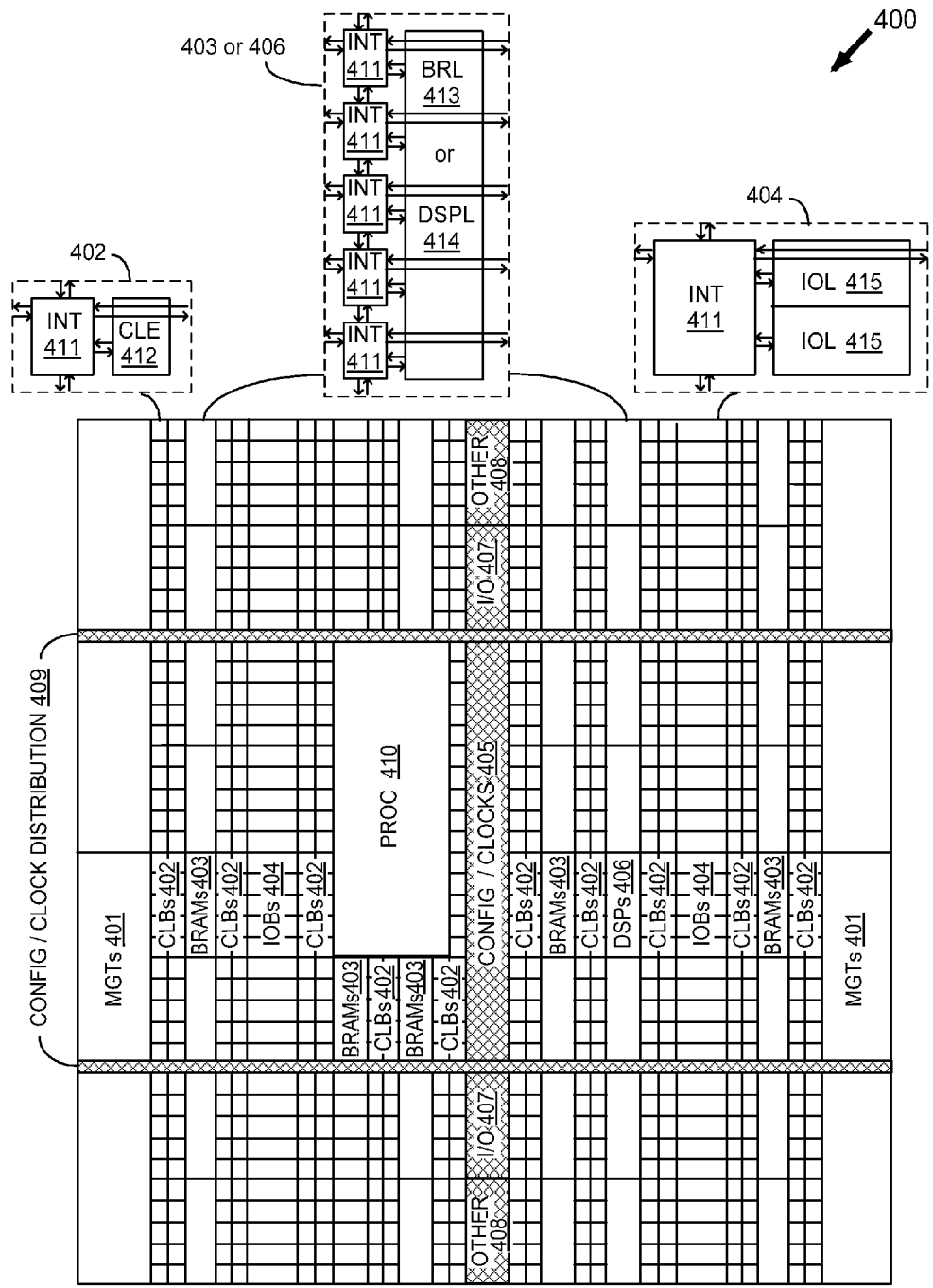
FIG. 4 is a floor plan of an FPGA suitable for testing according to an embodiment of the present invention.

FIG. 4 is a floor plan of an FPGA 400 suitable for testing according to an embodiment of the present invention. FPGA 400 includes a large number of different programmable tiles including multi-gigabit transceivers (MGTs 401), configurable logic blocks (CLBs 402), random access memory blocks (BRAMs 403), input/output blocks (IOBs 404), configuration and clocking logic (CONFIG/CLOCKS 405), digital signal processing blocks (DSPs 406), specialized input/output blocks (I/O 407) (e.g., configuration ports and clock ports), and other programmable logic 408 such as digital clock managers, analog-to-digital converters, system monitoring logic, and so forth. Some FPGAs also include dedicated processor blocks (PROC 410).

In some FPGAs, each programmable tile includes a programmable interconnect element (INT 411) having standardized connections to and from a corresponding interconnect element in each adjacent tile. Therefore, the programmable interconnect elements taken together implement the programmable interconnect structure for the illustrated FPGA. The programmable interconnect element (INT 411) also includes the connections to and from the programmable logic element within the same tile, as shown by the examples included at the top of FIG. 4.

For example, a CLB 402 can include a configurable logic element (CLE 412) that can be programmed to implement user logic plus a single programmable interconnect element (INT 411). A BRAM 403 can include a BRAM logic element (BRL 413) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 406 can include a DSP logic element (DSPL 414) in addition to an appropriate number of programmable interconnect elements. An IOB 404 can include, for example, two instances of an input/output logic element (IOL 415) in addition to one instance of the programmable interconnect element (INT 411). As will be clear to those of skill in the art, the actual I/O pads connected, for example, to the I/O logic element 415 are manufactured using metal layered above the various illustrated logic blocks, and typically are not confined to the area of the input/output logic element 415.

In the pictured embodiment, a columnar area near the center of the die (shown shaded in FIG. 4) is used for configuration, clock, and other control logic. Horizontal areas 409 extending from this column are used to distribute the clocks and configuration signals across the breadth of the FPGA.

Some FPGAs utilizing the architecture illustrated in FIG. 4 include additional logic blocks that disrupt the regular columnar structure making up a large part of the FPGA. The additional logic blocks can be programmable blocks and/or dedicated logic. For example, the processor block PROC 410 shown in FIG. 4 spans several columns of CLBs and BRAMs.

Note that FIG. 4 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 4 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

For many FPGA devices, such as FPGA 400 of FIG. 4, core logic elements such as CLBs 402 are powered by a main voltage supply (VDD), I/O circuitries by VCCO and other modules by a separate auxiliary voltage supply (VCCAUX), where VCCAUX and VCCO are typically greater than VDD. Many resources of FPGA, such as the configuration memory cells, are powered by an internal voltage (Vgg) that is typically generated using a well-known bandgap reference voltage (Vbg_ref). In some FPGAs, for example, VDD has a voltage of between approximately 1.0-1.2 volts, VCCAUX has a voltage of approximately 2.5 volts, and Vgg is typically regulated to approximately one transistor threshold voltage (VT) above VDD (e.g., to between approximately 1.3-1.5 volts).

The configuration bits are provided to control various configurable elements within I/O circuitry and core logic. The FPGA 400 was set to a minimum Vgg value using a cold-test simulation configuration bitstream, and tested at room temperature using standard test patterns fault-coverage to screen for low-temperature defects.

As any person of ordinary skill in the art of integrated circuits will recognize from the description, figures, and examples that modifications and changes can be made to the embodiments of the invention without departing from the scope of the invention defined by the following claims.

What is claimed is:

1. A method of testing an integrated circuit ("IC") comprising:
   characterizing operation of an internal voltage supply of the IC at a low temperature below room temperature or at a high temperature above room temperature to define a temperature-equivalent internal voltage level;
   setting the internal voltage supply of the IC to the temperature equivalent internal voltage level; and
   electrically testing the IC at room temperature at the temperature-equivalent internal voltage level to screen temperature defects in the IC.

2. The method of claim 1 wherein setting the internal voltage supply of the IC includes configuring an internal voltage supply generation circuit of a field-programmable gate array using a first test configuration bitstream.

3. The method of claim 2 wherein the internal voltage supply generation circuit is configurable over a range including a maximum configurable internal voltage and a minimum configurable internal voltage, and the internal voltage supply is configured to produce the minimum configurable internal voltage to define the temperature-equivalent internal voltage level.

4. The method of claim 2 wherein the first test configuration bitstream configures a programmable resistor in the internal voltage supply generation circuit to produce the temperature-equivalent internal voltage level.

5. The method of claim 2 wherein the internal voltage supply is generated from a regulated internal voltage supply.

6. The method of claim 5 wherein the internal voltage supply is a Vgg supply generated using a band gap voltage reference source in combination with a programmable resistor network, and setting the internal voltage supply level includes programming the programmable resistor network so that the Vgg supply produces the temperature-equivalent internal voltage level.

7. The method of claim 5 wherein the regulated internal voltage supply is a Vgg supply configurable to provide a voltage between 1.3 Volts and 1.65 Volts.

8. The method of claim 1 wherein the internal voltage supply is a regulated Vgg supply and the IC has a default Vgg setting, the temperature-equivalent internal voltage level being less than the default Vgg setting.

9. The method of claim 1 wherein electrically testing the IC at room temperature at the temperature-equivalent internal voltage level comprises an electrical wafer test at a low-temperature equivalent internal voltage level.

10. The method of claim 1 further comprising
    setting the internal voltage supply of the IC to a default internal voltage level; and
    electrically testing the IC at the default internal voltage level.

11. The method of claim 10 wherein the setting the internal voltage supply of the IC to the default internal voltage level uses a configuration bitstream and occurs after electrically testing the IC at room temperature at the temperature-equivalent internal voltage level.

12. The method of claim 10 wherein electrically testing the IC at room temperature and at the temperature-equivalent internal voltage level comprises an electrical wafer test and further comprising singulating the IC from a wafer before electrically testing the IC at the default internal voltage level.

13. The method of claim 10 wherein electrically testing the IC at the default internal voltage level is performed at room temperature.

14. The method of claim 10 wherein the IC is a field-programmable gate array, setting the internal voltage supply of the IC to the temperature-equivalent internal voltage level includes configuring an internal voltage supply generation circuit of a field-programmable gate array using a first test configuration bitstream, and setting the internal voltage supply of the IC to the default internal voltage level includes configuring the internal voltage supply generation circuit of the field-programmable gate array using a second test configuration bitstream.

15. The method of claim 14 wherein the internal voltage supply generation circuit includes a resistor network having a plurality of resistors in series, a plurality of nodes between the plurality of resistors, and a multiplexer connected to the plurality of nodes and providing an output, the first test configuration bitstream configuring the multiplexer to connect to a first node to provide a first resistance and the second test configuration bitstream configuring the multiplexer to connect to a second node to provide a second resistance.

16. The method of claim 15 wherein the first resistance is a resistance designed-for-test ("DFT") to achieve the temperature-equivalent internal voltage level.

17. The method of claim 16 wherein the resistance DFT is less than any other resistor in the plurality of resistors.

18. The method of claim 16 wherein the resistance DFT is greater than any other resistor in the plurality of resistors.

19. The method of claim 15 wherein the first resistance is a resistance designed-for-test ("DFT") to achieve a low-temperature equivalent internal voltage level.

20. The method of claim 10 wherein electrically testing the IC at room temperature and at the temperature-equivalent internal voltage level uses a test pattern and electrically testing the IC at the default internal voltage level uses the test pattern.

* * * * *